Feb. 8, 1966 L. LEVENTHAL ETAL 3,234,386

PLURAL ELONGATED RADIATION DETECTORS IN TWO PLANES FOR SCANNING A SURFACE FOR CONTAMINATION

Filed Sept. 5, 1961 2 Sheets-Sheet 1

INVENTOR.
LEON LEVENTHAL
SEYMOUR TARRAS
BY
Weingarten, Orenbuch & Pandiscio
ATTORNEY INVENTOR.
LEON LEVENTHAL
SEYMOUR TARRAS
BY
Weingarten, Orenbuch & Pandiscio
ATTORNEY 3,234,386

PLURAL ELONGATED RADIATION DETECTORS IN TWO PLANES FOR SCANNING A SURFACE FOR CONTAMINATION

Leon Leventhal, Berkeley, and Seymour Tarras, Oakland, Calif., assignors, by mesne assignments, to Laboratory for Electronics, Inc., Boston, Mass., a corporation of Delaware Filed Sept. 5, 1961, Ser. No. 136,031
4 Claims. (Cl. 250—83.3)

Figure 1:
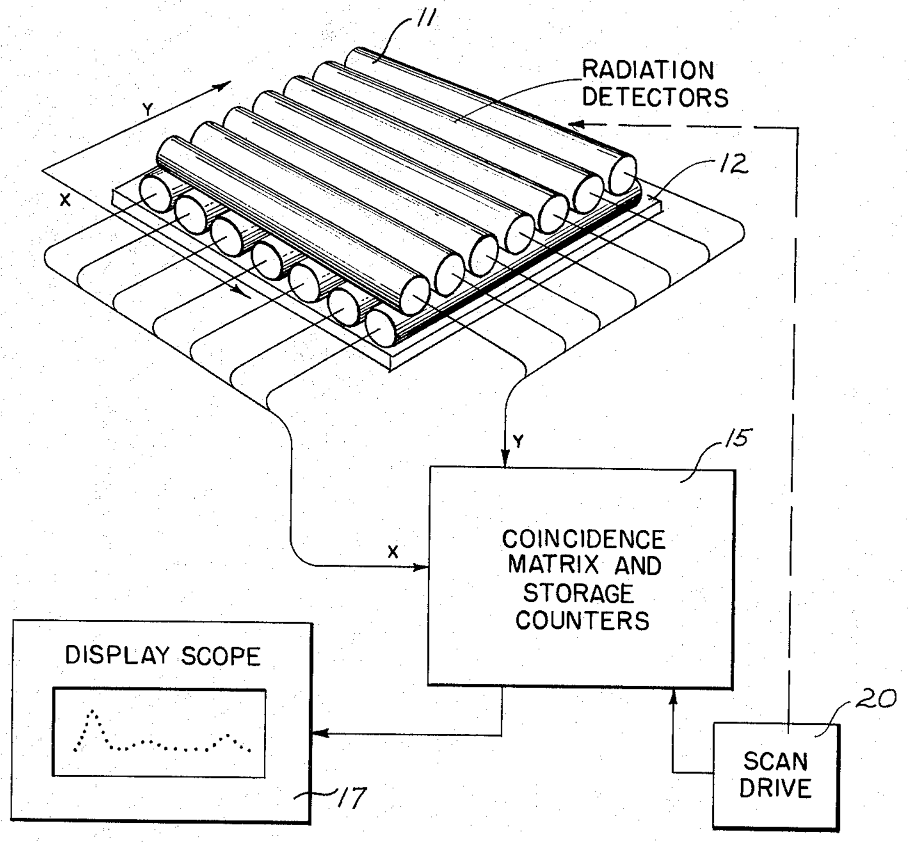

This invention relates in general to the construction of printed circuit boards and, more particularly, to a method of production testing of printed circuit boards to detect faulty soldered joints.

Printed circuit boards are now well known and widely used in the electronic art. While this technique of construction has found wide application in many applications of electronics, one of the key uses for printed circuit boards lies in the computer applications which require a large number of reiterated circuits and in which space is often at a premium. One of the most significant requirements of computer circuitry is the requirement of very high reliance and stability. Thus, in many cases, thousands of electronic components are involved and a failure in one or more of these components at a critical juncture may result in the entire apparatus being inoperative. This problem of reliability assumes particular importance where the electronic apparatus is to be used to control experiments of a critical, scientific nature or of a very high economic cost. In the design of equipment of this type, the individual components, themselves, may be selected to have an expected useful life many times the required life of the equipment, thus providing an extremely low probability of component failure. Perhaps the chief remaining cause of instability lies in defects in the solder connecting joints between the components, particularly those which may be described as "latent defects." Into this class of defects fall solder joints which initially provide functional operation, but which contain weaknesses providing a high probability of failure in a relatively short time operation. Such defects are particularly insidious in that the device may function properly through a series of tests, but may fail to operate at the critical time. The failure to operate at the critical time is caused essentially by the solder joints opening such that an imperfect or high resistance connection is formed.

In general, the causes of imperfect solder joints of this nature have been attributed to residual stress resulting from improper formation of the joint in terms of matched temperature coefficients of the solder and connecting points; vibration stress which loosens joints containing inherent weaknesses; and temperature cycling where an experience of relatively wide fluctuations in temperature causes the latent defect to become an actual defect inhibiting the operation of the device.

In the normal soldering process for printed circuit boards, flux completely covers the component metals and as the temperature is raised, solder wets the metal and is drawn by capillary action into the voids existing in the joint. This solder, then, forms the normal meniscus fillet. This capillary action will only take place if the solder wets the metals and during this process the flux is floated off the metal surface and carried to the outer liquid surface of the solder. The excess flux is then washed off the surface of the solder. The imperfections in this process which give rise to inherent defects may then be classified in three categories; namely, (1) voids, (2) incomplete wetting of the component metals, and (3) improper fillets.

While the above defects are, as mentioned, most troublesome in cases where the initial functional operation is adequate, they also provide a significant problem even when the initial functional test shows the unit inoperative. This is so because the functional testing will, in many cases, involve relatively time consuming and expensive test methods and in some others will require partial assembly of several component boards.

In the past, various methods of non-destructive production testing prior to any functional testing have been used. One such method is the method of visual inspection, which involves scanning the board visually to determine the location of the contaminant materials and imperfect joints. This method has some serious disadvantages in that it lacks sensitivity for contaminants on the surface of the board and solder joint and, of course, is almost entirely ineffective in determining imperfections within the solder joint itself, or at the interface of the solder and the board.

Another technique, which has been used in the past, involves X-ray inspection of the circuit boards. In this method the solder joints are X-rayed and voids within the joints are located. This method again lacks sensitivity in that only voids of relatively large size are indicated and improper wetting and the like are not determined at all. The presence of contaminant is again not shown by X-ray examination. Perhaps a more serious drawback of the X-ray method is it inapplicability to fast routine economic production operation, as well as the possible radiation damage to some electronic components mounted on the board.

A third method involves the tagging of materials which may contaminate the surface with fluorescent materials which may subsequently be located with ultraviolet excitation, or the like. Again, this method, which may yield some promising results in terms of surface contamination, is limited to surface contamination entirely.

It is a primary object of the present invention to provide a processing method including a production testing method for determining inherent defects, both at the surface and within solder joints.

It has been discovered that the basic cause of imperfect solder joints is contamination of the joint by occluded flux, process paints, or other processing contaminants. Even in the case of voids within the solder joint a residue of the contaminant has generally been found within the joint although the outer surfaces may be entirely clean. The technique of the present invention involves adding a radioactive tracer material to the flux materials, the process paints and other possible contaminant materials prior to the soldering process. The boards are then soldered and processed in the usual manner. At the conclusion of this processing, the boards are surveyed with radiation detection equipment, adapted to respond to amounts of radioactivity above a predetermined level, and the indication of significant radioactivity remaining at any particular location on the board will be indicative of defective solder joints. This technique provides indication of surface contamination and, even more importantly, of the internal contamination since the radioactive isotope used is selected to have a sufficiently penetrating radiation to escape the solder material. Since, as above indicated, the voids within the solder joints are, in most cases, attributable to contaminant materials, this method will also provide reliable indication of voids within the solder joints.

It is, therefore, another object of the present invention to provide an economic, efficient method of precision testing the solder joints in printed circuit board production to determine the location of internal voids and contamination, as well as external imperfections.

It is still another object of the present invention to provide a production testing method and apparatus for locating hidden defects in solder joints on printed circuit boards.

It is yet another object of the present invention to provide an economic, efficient method for determining the presence of contaminant materials both within and on the surface of solder joints.

Figure 2:
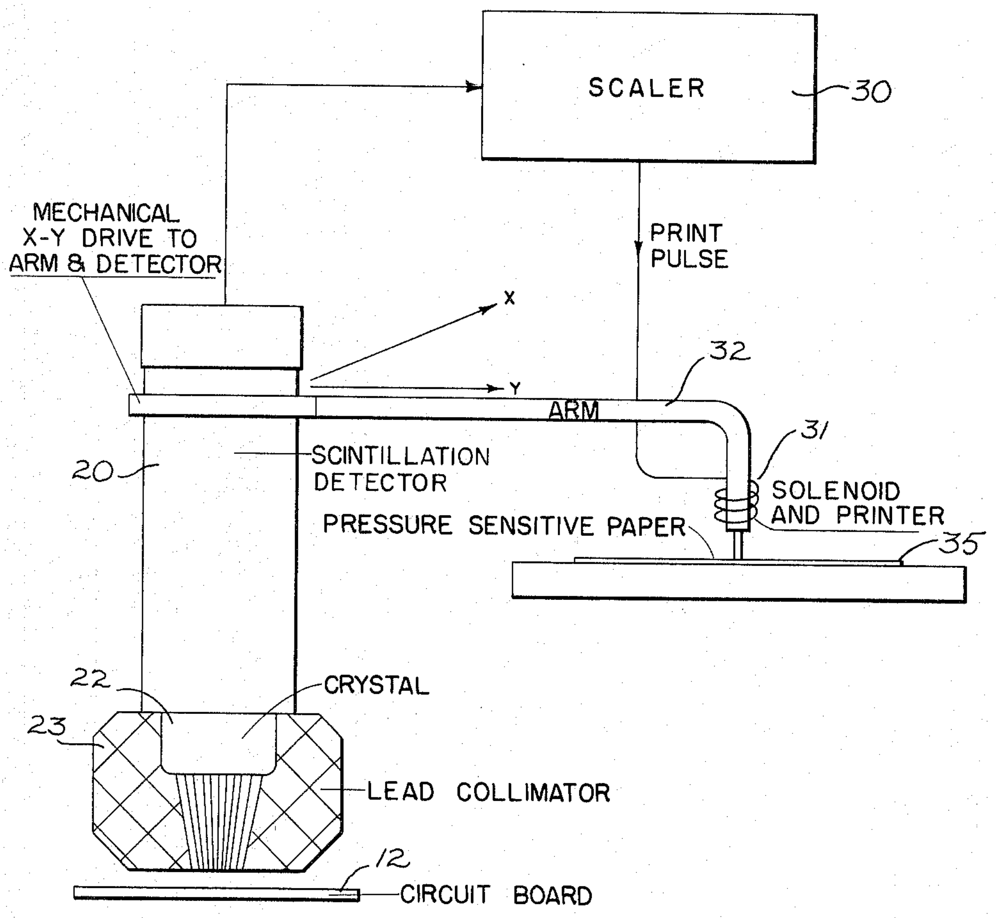

Other objects and advantages will become apparent from the following detailed description, when taken in conjunction with the accompanying drawing in which:

FIG. 1 is an illustration in block diagrammatic form of a production testing device in accordance with the principles of this invention; and FIG. 2 is an illustration partially in diagrammatic and partially in cross-sectional view of a second embodiment of a production testing device in accordance with the principles of this invention.

With reference now specifically to FIG. 1, a production testing device adapted to operate as an inspection tool for printed circuit boards in which the contaminant materials have been tagged with a radioactive tracer is shown. A matrix of irradiation detectors 11 established along $x$–$y$ coordinates is shown located above the surface of the printed circuit board 12 to be tested. These radiation detectors might typically have dimensions of a ¼ inch diameter and a length of 2¼ inches, thus establishing an inspected area of 2¼ by 2¼ inches, corresponding to some typical circuit board sizes. Each of the detectors 11 aligned with its longitudinal axis along the $y$ coordinate is electrically coupled to the $x$ input of the coincidence matrix and storage counter 15, while each of the detectors 11 having its longitudinal axis extending along the $x$ coordinate is electrically connected to the $y$ input of the coincidence matrix and storage counter 15. The coincidence matrix and storage counter 15 is a typical coincidence circuit having an input discrimination level corresponding to a predetermined amount of radiation falling upon the individual counter. Thus, when a solder joint containing an excessive amount of radioactively tagged contaminant is located at a particular point under the matrix of radiation detector, the respective detectors in the $x$ and $y$ coordinates corresponding to the coordinate location of that point, will provide a coincidence at the matrix in storage counter 15 and this coincidence will provide a stored pulse in an address corresponding to this $x$–$y$ position. The output of the coincidence matrix and storage counter may be presented in a variety of ways, a typical example being the display scope 17 illustrated in FIG. 1. A scan drive unit 20 is coupled to the radiation detectors and to the storage counter unit 15 to provide both scanning of the detectors when desired over the surface of boards larger than the area covered by the detector matrix itself and to provide reset signals to the coincident storage unit 15 as the matrix of detectors is scanned.

The detectors themselves may be any suitable form of radiation detector, Geiger Mueller tubes and scintillation counters being typical examples. With reference now particularly to FIG. 2, another production testing device for utilization in this technique is shown. In this instance, an individual detector 21, which is here shown as a scintillation detector, has a scintillating crystal 22 as its sensitive element included within a lead collimator 23. The lead collimator is scanned along the circuit board 12 in a pattern which provides complete coverage in both the $x$ and $y$ coordinates. The lead collimator serves the purpose of restricting the area which is viewed at any one time by the scintillating crystal 22 to a small diameter area on the surface of the board, typically ⅛ inch diameter. A mechanical $x$–$y$ drive (not shown) for the detector moves the detector across the $x$ and $y$ coordinates according to the prearranged pattern. The signal output of the detector 25 is provided to a scaler unit 30. This scaler unit is equipped with a preset count selector, such that it may be preset to a predetermined number of total counts and whenever this number of counts is reached within a specified time, an output pulse is provided to a solenoid printing unit generally illustrated at 31. The solenoid printer is attached to a mechanical arm 32 which is arranged to move in the conjunction with the detector and to control the printing element above a pressure sensitive paper 35. The overall operation, then, is that as the detector is moved providing an individual scan over the surface of the circuit board, the arm 32 moves in exactly the same pattern over the pressure sensitive paper and provides an imprinted character whenever the scaler exceeds its preset limit. The number of counts selected for the scaler to provide an output printing pulse is determined to be that number corresponding to a significant amount of radioactively tagged contaminant within a particular joint and will vary depending upon the specific activity of the selected contaminant, the sensitivity of the scintillation detector and the time constant of the scanning.

A number of radioactive isotopes may be utilized for tagging the contaminant materials. The isotope must, of course, be in a form which can be homogeneously admixed with the contaminant materials and remain with it through the entire process. In addition, the emitted radiation must be sufficiently penetrating to allow it to escape through the solder. Some suitable isotopes are listed below together with their pertinent characteristics.

| | Type of Emission | Half-Life |
|---|---|---|
| Y-90 | 2.27 m.e.v. $\beta$ | 64.0 hours. |
| Na-24 | 1.4 m.e.v. $\beta$; $\gamma$ | 15.0 hours. |
| Au-198 | .96, .28, 1.37 m.e.v. $\beta$; $\gamma$ | 2.7 days. |
| Br-82 | .46 m.e.v. $\beta$; $\gamma$ | 35.9 hours. |

It has been found, in a typical example, that a concentration of 1 millicurie per liter of flux is sufficient to detect the presence of $\frac{1}{64}$″ diameter spherical voids within solder joints.

While specific radioisotopes have been discussed above and two specific embodiments of production testing device have been described, the invention is not so limited. The invention having been described, numerous modifications and departures will now become apparent to those skilled in this art and the invention herein should be construed as limited only by the spirit and scope of the appended claims.

What is claimed is:

1. Apparatus for determining the location and intensity of radioactive deposits within a predetermined area comprising, a first array of elongated radiation detectors disposed in a plane, each of said detectors having its longitudinal axis parallel with the longitudinal axes of the remainder of said detectors in said first array; a second array of elongated radiation detectors disposed in a plane parallel to the plane of said first array of radiation detectors, each of said detectors in said second array having its longitudinal axis parallel with the remainder of said detectors in said second array and transverse the longitudinal axes of said detectors in said first array, said first array of detectors being approximately superposed over said second array of detectors such that the overlapping areas of individual ones of said detectors in said first and said second array form a rectilinear matrix; circuit means, each of sad radiation detectors being independently connected electrically to said circuit means, said circuit means being adapted to provide an output signal when one of said first array of radiation detectors produces an output signal exceeding a predetermined magnitude in substantial time coincidence with one of said array of radiation detectors providing an output exceeding said predetermined magnitude, said circuit means output signal providing an indication of which detectors in each of said first and second arrays produced said coincidenced outputs exceeding said predetermined magnitude.

2. Apparatus in accordance with claim 1 wherein said circuit means comprises a plurality of first input terminals, each of said first input terminals being electrically connected to one of said radiation detectors in said first array; a second set of input terminals, each of said second set of input terminals being electrically connected to one of said radiation detectors in said second array, each of said first input terminals being electrically interconnected to each of said second set of input terminals, each of said electrical interconnections being made through an individual coincidence circuit, each of said coincidence circuits thereby representing one of said overlap areas forming said rectilinear matrix.

3. Apparatus in accordance with claim 1 and including an oscilloscope output display coupled to said circuit means and adapted to provide a visual indication of the location of radiation detectors providing an output exceeding said predetermined magnitude in substantial time coincidence.

4. Apparatus in accordance with claim 1 and including a mechanical scan system adapted to move said first and second arrays of radiation detectors in a predetermined pattern over said area.

References Cited by the Examiner

UNITED STATES PATENTS

| | | | |
|---|---|---|---|
| 2,776,377 | 1/1957 | Anger | 250—71.5 |
| 2,968,733 | 1/1961 | Dvorkovitz et al. | 250—106 |
| 2,976,421 | 3/1961 | Bayfield | 250—83.6 |
| 3,018,374 | 1/1962 | Pritchett | 250—71.5 |
| 3,020,409 | 2/1962 | Clement | 250—106 |
| 3,032,657 | 5/1962 | Meier et al. | 250—71.5 |

OTHER REFERENCES

Arthur: Abstract of application Serial No. 206,829, published February 26, 1952, 655 O.G. 1177.

Brownell: "Theory of Radioisotope Scanning," International Journal of Applied Radiation and Isotopes, 1958, volume 3, pages 181–192.

"Fighting Flux Contamination," Electronic Industries, November 1959, pages 110 and 246.

Green et al.: "A Free Running Isodose-Tracing Machine," Nucleonics, April 1958, pages 92–94.

MacIntyre et al.: "Techniques for the Visualization of Internal Organs . . ." International Journal of Applied Radiation and Isotopes, April 26, 1957, volume 3, pages 193–206.

Morris: "A Linear Scanner for Human Radioisotope Research," Atomic Energy Commission Document Orins-33, dated March 1960.

RALPH G. NILSON, *Primary Examiner.*

ARCHIE R. BORCHELT, *Examiner.*